(12) United States Patent
Soemers et al.

(10) Patent No.: US 7,884,920 B2
(45) Date of Patent: Feb. 8, 2011

(54) LITHOGRAPHIC APPARATUS AND PIVOTABLE STRUCTURE ASSEMBLY

(75) Inventors: Hermanus Mathias Joannes Rene Soemers, Mierlo (NL); Felix Godfried Peter Peeters, Lieshout (NL)

(73) Assignee: ASML Netherlands B.V., Veldhoven (NL)

( * ) Notice: Subject to any disclaimer, the term of this patent is extended or adjusted under 35 U.S.C. 154(b) by 858 days.

(21) Appl. No.: 11/812,228

(22) Filed: Jun. 15, 2007

(65) Prior Publication Data

US 2008/0309901 A1 Dec. 18, 2008

(51) Int. Cl.
*G03B 27/42* (2006.01)

(52) U.S. Cl. .................. 355/53; 359/225.1; 359/224.1; 310/328

(58) Field of Classification Search ............ 355/53, 355/67; 359/201.2, 212.1, 212.2, 223.1, 359/225.1, 226.1, 226.2, 555, 224.1; 310/311, 310/328; 318/49
See application file for complete search history.

(56) References Cited

U.S. PATENT DOCUMENTS

| | | | | |
|---|---|---|---|---|
| 4,941,740 A * | 7/1990 | Sigman | ...................... | 359/876 |
| 5,159,225 A * | 10/1992 | Um | ........................... | 310/328 |
| 5,410,206 A * | 4/1995 | Luecke et al. | ............... | 310/328 |
| 5,469,302 A * | 11/1995 | Lim | .......................... | 359/846 |
| 5,616,982 A * | 4/1997 | Um et al. | ..................... | 310/328 |
| 6,059,250 A * | 5/2000 | Reuter et al. | ................ | 248/476 |
| 6,625,895 B2 * | 9/2003 | Tacklind et al. | ............... | 33/286 |
| 6,788,386 B2 * | 9/2004 | Cox et al. | ...................... | 355/53 |
| 7,035,056 B2 * | 4/2006 | Franken et al. | ........... | 360/294.4 |
| 7,136,214 B2 * | 11/2006 | Loopstra et al. | ............. | 359/290 |
| 2002/0038987 A1 * | 4/2002 | Magnussen et al. | .... | 310/323.16 |
| 2003/0227606 A1 * | 12/2003 | Sweatt | ........................ | 355/53 |
| 2004/0074300 A1 * | 4/2004 | Karrai et al. | ............. | 73/514.34 |
| 2005/0057827 A1 * | 3/2005 | Miyachi et al. | .............. | 359/849 |
| 2006/0164619 A1 * | 7/2006 | Back et al. | ..................... | 355/67 |

\* cited by examiner

*Primary Examiner*—Hung Henry Nguyen
*Assistant Examiner*—Steven H Whitesell-Gordon
(74) *Attorney, Agent, or Firm*—Sterne, Kessler, Goldstein & Fox P.L.L.C

(57) ABSTRACT

A mirror assembly to interact with a beam of radiation of a lithographic apparatus is disclosed. The mirror assembly includes a mirror, a piezo electric actuator, and a mover structure, the mover structure connected to the mirror, an assembly of the mirror and the mover structure being pivotable about a pivot point, the piezo electric actuator having a contacting surface to establish a slip-stick contact with the mover structure.

20 Claims, 2 Drawing Sheets

LITHOGRAPHIC APPARATUS AND PIVOTABLE STRUCTURE ASSEMBLY

FIELD

The present invention relates to a pivotable structure assembly.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Due to the demands in lithography to obtain patterns having smaller and smaller structures, many developments take place to be able to fulfil these requirements. One of these developments is, for example, the use of diffraction patterns, thereby making use of optical diffraction when projecting a pattern onto the substrate. To be able to make use of diffraction phenomena, a radiation beam from a light source may be projected onto the patterning device under an oblique angle, i.e. under an angle, which differs from 90 degrees with respect to a surface of the patterning device. In order to obtain such oblique incident radiation beam, use may be made of, for example, a mirror or mirror assemblies.

SUMMARY

It is desirable, for example, to provide a reliable, high resolution positioning of a mirror. In general, high-resolution positioning and/or high reliability of a pivotable structure is desired.

According to an embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate;
a mirror assembly to interact with the radiation beam, the mirror assembly comprising:
a mirror structure being pivotable about at least one axis and comprising a reflecting surface, and
an actuator to pivot the mirror structure, the actuator having a contacting surface to establish a slip-stick contact with a contacting part of the mirror structure.

In an embodiment of the invention, there is provided a pivotable structure assembly comprising:
a pivotable structure pivotable about at least one axis; and
an actuator to pivot the pivotable structure, the actuator having a contacting surface to establish a slip-stick contact with a contacting part of the pivotable structure.

In an embodiment of the invention, there is provided a mirror assembly, comprising:
a mirror;
a mover structure connected to the mirror and pivotable about a pivot point; and
a piezo electric actuator having a contacting surface to establish a slip-stick contact with the mover structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
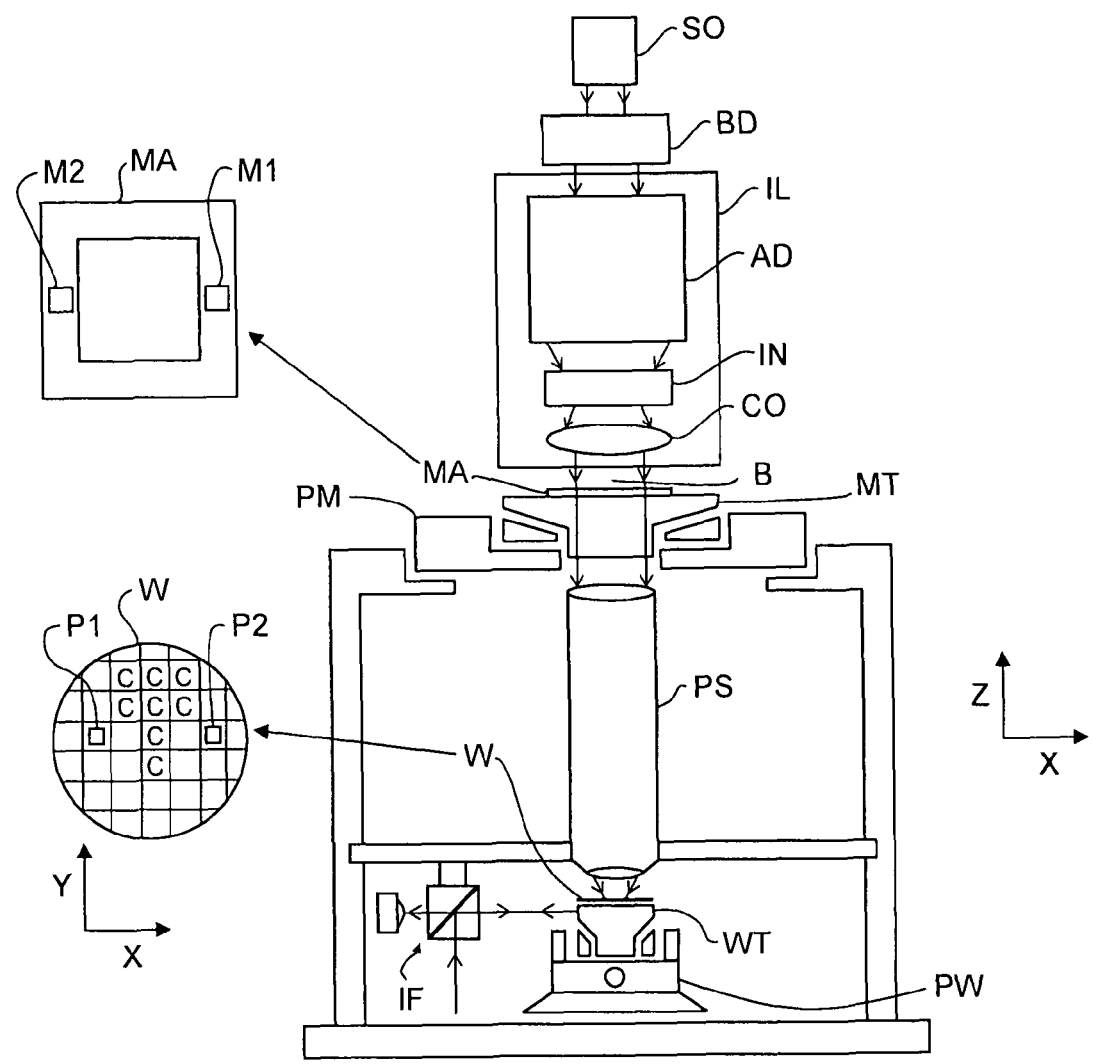
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables or support structures may be used in parallel, or preparatory steps may be carried out on one or more tables or support structures while one or more other tables or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support structure (e.g., mask table) MT, and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support structure MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioner PW. In the case of a stepper (as opposed to a scanner) the patterning device support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support structure MT and the substrate table WT are scanned synchronously while a pattern imparted to the radiation beam is projected onto a target portion C (i.e. a single dynamic exposure). The velocity and direction of the substrate table WT relative to the patterning device support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
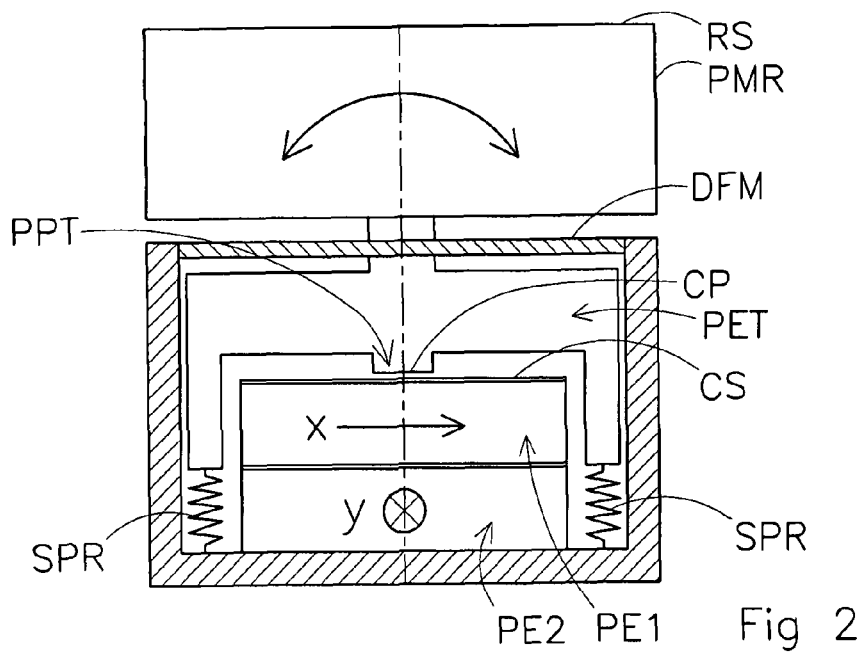
FIG. 2 depicts a schematic view, partly in cross-section, of a pivotable structure assembly, such as a pivotable mirror assembly, of the lithographic apparatus according to FIG. 1.

FIG. 2 depicts a pivotable structure, in this example being a pivotable mirror PMR having a reflecting surface RS and being pivotable about a pivot point PPT as will be discussed in more detail below. A mirror structure, or in more general terms a pivotable structure, comprises the pivotable mirror PMR along with a pivotable element PET. As the pivotable mirror PMR is rigidly connected to the pivotable element PET, and may in fact form a single part, the pivotable structure or mirror structure may pivot as a whole about the pivot point PPT. An actuator is formed by an assembly of a piezo electric element PE1 stacked on top of a piezo electric element PE2. In an embodiment, a single piezo electric element or other type of actuator may be applied. The actuator, in this example the stacked piezo electric elements PE1, PE2, comprises a contacting surface CS. The pivotable element PET of the mirror structure is provided with a contacting part CP to contact the contacting surface CS. Although in this embodiment the pivotable element PET and the pivotable mirror PMR have been depicted as being separate entities, the pivotable element PET and the pivotable mirror PMR or other pivotable structure may form an integral part.

Upon actuation of the actuator, comprising in this example of piezo electric elements PE1, PE2, the contacting surface CS will move in a corresponding direction. For example, when actuating the first piezo electric actuator PE1, the contacting surface CS may translate in the x-direction, i.e. in the plane of drawing of FIG. 2 from left to right or right to left, while when actuating the second piezo electric element PE2, the contacting surface may move in the y-direction, i.e. in a direction perpendicular to the plane of drawing of FIG. 2. As the contacting part CP of the mirror structure (or more generally of the pivotable structure) makes contact with the contacting surface CS of the actuator, a force will be transferred onto the contacting part CP, and therefore on the mirror structure or pivotable structure. As will be discussed in some more detail below with reference to FIGS. 3a and 3b, a relatively slow movement of the contacting surface CS will cause the contacting part CP, and therefore the pivotable mirror structure (i.e. the pivotable element PET in conjunction with the pivotable mirror PMR) to follow. If however the actuator is actuated to provide for movement of the contacting surface CS at a relatively high speed or acceleration, slip will take place, e.g., the contacting surface CS will slip with respect to the contacting part CP. Thus, on the one hand a high resolution positioning of the pivotable mirror may be provided, as small translations of the contacting surface CS will translate into small angular displacements of the pivotable mirror, while on the other hand a relatively large pivoting range may be obtained by a repeated slip-stick operation, i.e. a repeated pattern of a slow movement in one direction followed by a fast movement of the contacting surface CS in the opposite direction, which will each time tilt the assembly of the pivotable element PET and the pivotable mirror PMR with an additional amount. Making use of piezo electric actuators, resolution may be obtained in an order of magnitude of nanometers displacements of the contacting surface CS. A maximum displacement of the contacting surface CS itself is however limited. By the slip-stick operation, a maximum displacement of the contacting part CP in the plane parallel to the contacting surface CS can be made larger than the maximum displacement of the contacting surface CS itself.

In the embodiment shown here, use is made of a sheer piezo electric actuator to establish a movement of the contacting surface CS in a direction substantially in the plane parallel to the contacting surface CS. The two piezo electric actuators PE1, PE2 enable movements in x and y-directions, i.e. in this example in substantially orthogonal directions. By allowing the contacting surface CS to be moved in orthogonal directions (and thus in the plane parallel to the contacting surface CS), pivoting of the pivotable mirror PMR may be provided about the pivot point PPT, i.e., pivoting may be provided about the y-axis as well as about the x-axis.

In the embodiment shown, pivotability of the mirror structure is provided by having the mirror structure suspended in a diaphragm DFM. Thus, the pivot point may be accurately defined in the x-y plane, i.e. in a plane parallel to the contacting surface CS, while allowing for some flexibility in a direction perpendicular thereto to account for manufacturing tolerances, temperature effects, etc. To accurately follow the contacting surface CS, a surface of the contacting part CP may be convex, a radius of the convex surface substantially corresponding to a distance r between the surface of the contacting part CP and the pivot axis.

A protective layer may be provided on the contacting surface CS, such as a metallic layer.

Preloading may be provided to establish a sufficiently well defined contacting force of the contacting part CP on the contacting surface CS. In that respect, use may be made of a spring such as the springs SPR in FIG. 2. Many alternatives are possible. As an example, the diaphragm DFM may form a spring.

In a lithographic apparatus, a plurality of mirror assemblies depicted here may be provided, the reflecting surfaces of the mirror assemblies forming a mirror plane, each of the mirrors being tiltable by its respective actuator to enable pivoting of each of the mirrors. A separate measurement system may be provided to measure a position of the mirror, the measured position being applied by an appropriate control system to control the actuator. By individual pivoting of one or more of the mirrors, a spatial intensity pattern of a to be reflected radiation beam may be altered.

Figure 3A:
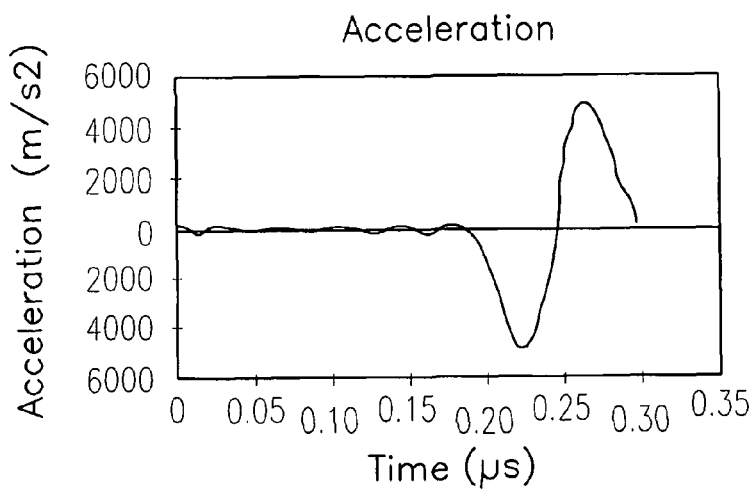
FIGS. 3a and 3b depict example actuation of the assembly of FIG. 2.
Figure 3B:
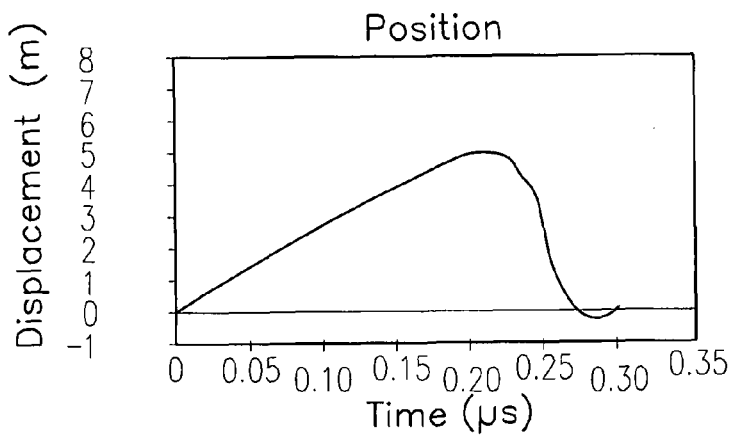

FIG. 3a shows an example of an acceleration of the piezo electric element, i.e. of the contacting surface CS thereof, versus time. Likewise, FIG. 3b depicts a corresponding displacement of the contacting surface CS versus time. FIG. 3a and FIG. 3b depict a cycle comprising a time period of constant velocity and a time period of negative acceleration and moving in reverse direction. It will be understood that the times as indicated in FIG. 3a and FIG. 3b are an example only: in this example, the cycle has a cycle time of approximately 0.30 microseconds. The time t=0 has been chosen arbitrarily, and represents a moment in the cycle. As of t=0, a time period follows in which the acceleration of the contacting surface of the piezo electric element is substantially zero, namely a time period in which the contacting surface moves at a constant speed. During this time period, the mirror structure follows the movement of the contacting surface, leading to a pivoting thereof (as will be understood from FIG. 2). Then (in this example from t=0.2 to t=0.3 microseconds) a substantially sine shaped acceleration pattern of the piezo electric element, i.e., of the contacting surface thereof, is provided, which provides for a negative acceleration and a movement of the contacting surface in reverse direction. During this acceleration pattern, slip between the contacting surface and the contacting part will take place, the mirror due to its inertia continuing to move in the same direction as before the negative acceleration. At t=0.3 microseconds, the piezo electric element, in particular the contacting surface thereof, has completed the acceleration cycle and has returned to the same position as at t=0, and returned to the same velocity as at t=0, after which a following cycle may take place. FIG. 3b shows a corresponding displacement of the contacting surface CS as a result of the contacting surface acceleration pattern shown in FIG. 3a.

An embodiment of the invention may not only be applied in a lithographic apparatus. In general, an embodiment of the invention may be applied for pivoting any pivotable structure at a high resolution. Thus, where in the above description reference is made to the tiltable mirror, any tiltable structure may be understood. Furthermore, the tiltable structure may have any shape or configuration and is thus not restricted to the embodiment depicted in FIG. 2 where an assembly comprises a mirror (or other structure) and a pivotable element PET. For example, the pivotable structure may form an integral part.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate;
    a mirror assembly to interact with the radiation beam, the mirror assembly comprising:
    a mirror structure being pivotable about at least one axis and comprising a reflecting surface, and
    an actuator to pivot the mirror structure, the actuator having a contacting surface to establish contact with a contacting part of the mirror structure,
    wherein the actuator is configured to move the mirror structure in a first direction by moving the contacting surface in a repeated pattern of movement of the contacting surface in the first direction at a first speed or acceleration followed by movement of the contacting surface in a second direction at a second speed or acceleration, wherein the second direction is substantially opposite to the first direction and the second speed or acceleration is greater than the first speed or acceleration.

2. The lithographic apparatus according to claim 1, wherein the actuator comprises a sheer piezo electric actuator to establish a movement of the contacting surface of the piezo electric actuator in a direction substantially in a plane parallel to the contacting surface.

3. The lithographic apparatus of claim 2, wherein the sheer piezo electric actuator comprises a dual layer sheer piezo electric actuator, each layer configured to establish movement of the contacting surface in a substantially orthogonal direction to the other layer.

4. The lithographic apparatus of claim 1, wherein the pivotability of the mirror structure is provided by the mirror structure being suspended in a diaphragm.

5. The lithographic apparatus of claim 4, wherein the diaphragm extends in a plane substantially parallel to the contacting surface.

6. The lithographic apparatus of claim 1, wherein a surface of the contacting part of the mirror structure is convex, a radius of the convex surface substantially corresponds to a distance between the surface of the contacting part and a pivot axis of the mirror structure.

7. The lithographic apparatus of claim 1, wherein the contacting surface of the actuator comprises a metallic layer.

8. The lithographic apparatus of claim 1, further comprising a spring to preload the minor structure onto the contacting surface.

9. The lithographic apparatus of claim 1, comprising a plurality of mirror assemblies, the mirror structures of the mirror assemblies being arranged to form a mirror plane, each of the mirror structures pivotable by its respective actuator and positioned in an optical path of the radiation beam.

10. A pivotable structure assembly comprising:
a pivotable structure pivotable about at least one axis; and
an actuator to pivot the pivotable structure, the actuator having a contacting surface to establish a slip-stick contact with a contacting part of the pivotable structure, wherein the actuator is configured to move the mirror structure in a first direction by moving the contacting surface in a repeated pattern of movement of the contacting surface in the first direction at a first speed or acceleration followed by movement of the contacting surface in a second direction at a second speed or acceleration, wherein the second direction is substantially opposite to the first direction and the second speed or acceleration is greater than the first speed or acceleration.

11. The pivotable structure assembly of claim 10, wherein the actuator comprises a sheer piezo electric actuator to establish a movement of the contacting surface of the piezo electric actuator in a direction substantially in a plane parallel to the contacting surface.

12. The pivotable structure assembly of claim 11, wherein the sheer piezo electric actuator comprises a dual layer sheer piezo electric actuator, each layer configured to establish movement of the contacting surface in a substantially orthogonal direction to the other layer.

13. The pivotable structure assembly of claim 10, wherein the pivotability of the pivotable structure is provided by the pivotable structure being suspended in a diaphragm.

14. The pivotable structure assembly of claim 13, wherein the diaphragm extends in a plane substantially parallel to the contacting surface.

15. The pivotable structure assembly of claim 10, wherein a surface of the contacting part of the pivotable structure is convex, a radius of the convex surface substantially corresponds to a distance between the surface of the contacting part and a pivot axis of the pivotable structure.

16. The pivotable structure assembly of claim 10, wherein the contacting surface of the actuator comprises a metallic layer.

17. The pivotable structure assembly of claim 10, further comprising a spring to preload the pivotable structure onto the contacting surface.

18. The pivotable structure assembly of claim 10, wherein the pivotable structure comprises a mirror having a reflecting surface.

19. The pivotable structure assembly of claim 10, wherein the actuator comprises a piezo electric actuator.

20. A mirror assembly, comprising:
a mirror;
a mover structure connected to the mirror and pivotable about a pivot point; and
a piezo electric actuator having a contacting surface to establish contact with the mover structure, wherein the piczo electric actuator is configured to move the mirror structure in a first direction by moving the contacting surface in a repeated pattern of movement of the contacting surface in the first direction at a first speed or acceleration followed by movement of the contacting surface in a second direction at a second speed or acceleration, wherein the second direction is substantially opposite to the first direction and the second speed or acceleration is greater than the first speed or acceleration.

* * * * *